US008045593B2

United States Patent
Gollier et al.

(10) Patent No.: US 8,045,593 B2
(45) Date of Patent: Oct. 25, 2011

(54) METHOD OF CONTROLLING A FREQUENCY-CONVERTED LASER SOURCE COMPRISING AN EXTERNAL OPTICAL FEEDBACK COMPONENT

(75) Inventors: Jacques Gollier, Painted Post, NY (US); Dmitri Vladislavovich Kuksenkov, Painted Post, NY (US)

(73) Assignee: Corning Incorporated, Corning, NY (US)

(*) Notice: Subject to any disclaimer, the term of this patent is extended or adjusted under 35 U.S.C. 154(b) by 192 days.

(21) Appl. No.: 12/419,560

(22) Filed: Apr. 7, 2009

(65) Prior Publication Data

US 2010/0254417 A1    Oct. 7, 2010

(51) Int. Cl.
*H01S 3/13* (2006.01)
*H01S 3/131* (2006.01)

(52) U.S. Cl. .......... 372/20; 372/32; 372/21; 372/22; 372/26; 372/28; 372/29.022

(58) Field of Classification Search .......... 372/32, 372/21, 22, 26, 28, 20, 29
See application file for complete search history.

(56) References Cited

U.S. PATENT DOCUMENTS

| 5,386,124 | A | 1/1995 | Yasuda et al. |
| 5,870,417 | A | 2/1999 | Verdiell et al. |
| 5,991,318 | A | 11/1999 | Caprara et al. |
| 6,496,299 | B2 * | 12/2002 | Yamamoto et al. .......... 359/328 |
| 2008/0175285 | A1 * | 7/2008 | Hu .......................... 372/28 |

FOREIGN PATENT DOCUMENTS

WO    9533293    A1    12/1995

* cited by examiner

*Primary Examiner* — Tod T Van Roy
*Assistant Examiner* — Joshua King
(74) *Attorney, Agent, or Firm* — Kwadjo Adusei-Poku

(57) ABSTRACT

A method of controlling a frequency-converted laser source is provided where the laser source comprises a laser cavity, an external optical feedback component, a wavelength selective component, and a wavelength conversion device and the method comprises driving a gain section of the laser cavity with a gain signal that comprises a data component and a modulation component. The modulation component of the gain signal comprises a gain modulation amplitude $I_{MOD}$ that is sufficient to shift the available cavity modes in the spectral domain such that lasing at several different cavity modes sequentially is established as the gain signal is modulated.

16 Claims, 3 Drawing Sheets

METHOD OF CONTROLLING A FREQUENCY-CONVERTED LASER SOURCE COMPRISING AN EXTERNAL OPTICAL FEEDBACK COMPONENT

BACKGROUND

The present disclosure relates to frequency-converted laser sources and, more particularly, to a frequency converted laser source configured for low level optical feedback and methods of controlling the same.

BRIEF SUMMARY

Although the various concepts of the present disclosure are not limited to lasers that operate in any particular part of the optical spectrum, reference is frequently made herein to frequency doubled green lasers, where wavelength fluctuations of the diode IR source typically generate fluctuations of the frequency-converted green output power. Such fluctuations are often attributable to the relatively narrow spectral acceptance curve of the wavelength conversion device used in the frequency-converted laser—typically a periodically poled lithium niobate (PPLN) SHG crystal. If the aforementioned frequency-converted laser is used in a scanning projector, for example, the power fluctuations can generate unacceptable image artifacts. For the specific case when the laser comprises a two or three-section DBR laser, the laser cavity is defined by a relatively high reflectivity Bragg mirror on one side of the laser chip and a relatively low reflectivity coating (0.5-5%) on the other side of the laser chip. The resulting round-trip loss curve for such a configuration is proportional to the inverse of the spectral reflectivity curve of the Bragg mirror. Also, only a discrete number of wavelengths called cavity modes can be selected by the laser. As the chip is operated, its temperature and therefore the refractive index of the semiconductor material changes, shifting the cavity modes relative to the Bragg reflection curve. As soon as the currently dominant cavity mode moves too far from the peak of the Bragg reflection curve, the laser switches to the mode that is closest to the peak of the Bragg reflection curve since this mode corresponds to the lowest loss—a phenomenon known as mode hopping.

Mode hopping can create sudden changes in output power and will often create visible borders between slightly lighter and slightly darker areas of a projected image because mode hops tend to occur at specific locations within the projected image. Sometimes, a laser will continue to emit in a specific cavity mode even when it moves away from the Bragg reflection peak by more than one free spectral range (mode spacing)—a phenomenon likely related to spatial hole burning and electron-photon dynamics in the cavity. This results in a mode hop of two or more cavity mode spacings and a corresponding unacceptably large change in output power. According to the subject matter of the present disclosure, laser configurations and corresponding methods of operation are provided to address these and other types of power variations in frequency-converted laser sources.

In accordance with one embodiment of the present disclosure, a method of controlling a frequency-converted laser source is provided where the laser source comprises a laser cavity, an external optical feedback component, a wavelength selective component, and a wavelength conversion device and the method comprises driving a gain section of the laser cavity with a gain signal that comprises a data component and a modulation component. The external optical feedback component in conjunction with the output facet of the laser contributes to the generation of periodic Fabry-Perot resonances resulting in a modulation of the loss curve of the system. The modulation component of the gain signal is characterized by a gain modulation amplitude $I_{MOD}$ that is sufficient to shift the cavity modes in the spectral domain such that sequential lasing at several different cavity modes is established for the laser cavity as the gain signal is modulated.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
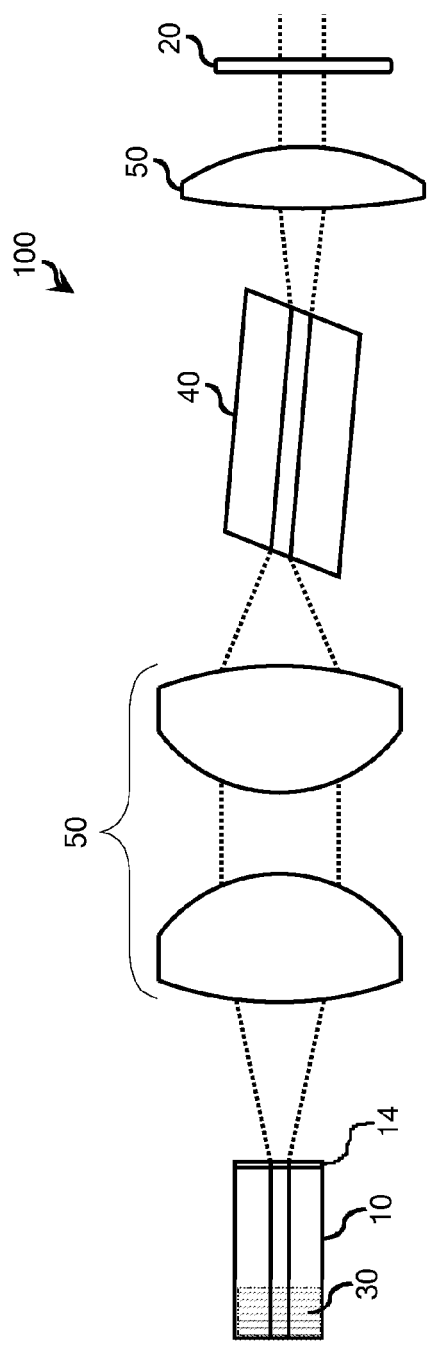
FIG. 1 is a schematic illustration of a frequency-converted laser source comprising a DBR laser diode and an external optical feedback component presented as a dichroic mirror.

Referring initially to FIG. 1, according to one embodiment of the present disclosure, a frequency-converted laser source 100 comprises a laser cavity presented in the form of a DBR laser diode 10, an external optical feedback component presented as a partly reflective mirror 20, a wavelength selective component presented as a distributed Bragg reflector 30 in the DBR laser diode 10, a wavelength conversion device presented as a waveguide PPLN crystal 40, and coupling optics 50. Although the present disclosure discusses the particular case where the laser source 100 comprises a DBR laser diode 10, which is used as an IR pump source, and a waveguide PPLN crystal 40, which is used for frequency doubling into the green wavelength range, it is noted that the concepts of the present disclosure are equally applicable to a variety of frequency-converted laser configurations including, but not limited to, configurations that utilize two or three-section DBR lasers, DFB lasers, Fabry-Perot lasers, external cavity lasers, etc., and configurations that utilize frequency conversion beyond second harmonic generation (SHG). The concepts of the present disclosure are also applicable to a variety of applications in addition to laser scanning projectors.

Figure 2:
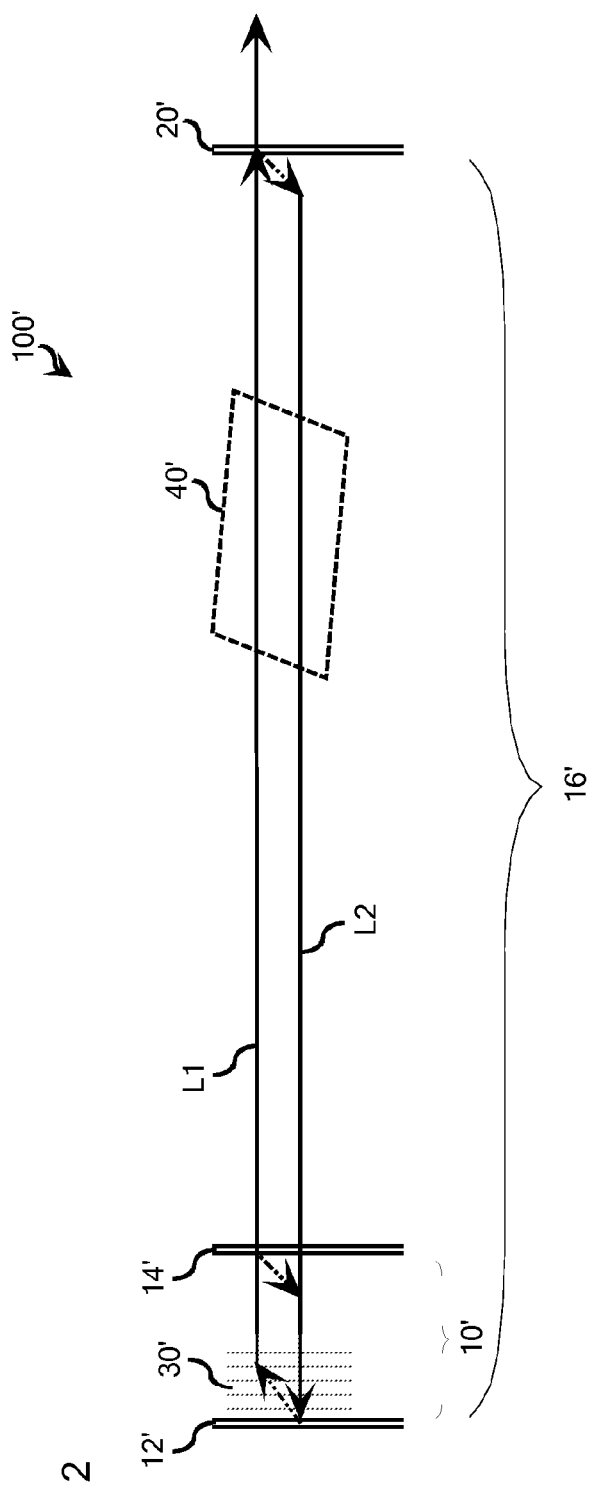
FIG. 2 is a generalized schematic illustration of a frequency-converted laser source.

FIG. 2 is a more generalized schematic illustration of a frequency-converted laser source 100 comprising a laser cavity 10', an external optical feedback component 20', a wavelength selective component 30', and a wavelength conversion device 40'. The laser cavity 10' comprises a gain medium that is interposed between a relatively high reflectivity rear reflector 12' and a relatively low reflectivity output reflector 14'. A portion of the light from the laser cavity 10' is emitted through the output reflector 14' along an output path L1, while the remaining light bounces back and forth in the laser cavity 10', each time passing through the gain medium. The external optical feedback component 20' is displaced from the output reflector 14' along the optical path of the laser source 100 and is configured to form an extended cavity 16' by partially reflecting the emitted light L1 along a return path L2 to the laser cavity 10' through the output reflector 14'. The output and return paths L1, L2 will typically be co-linear but are illustrated as separate optical paths in FIG. 2 for clarity.

Figure 3:
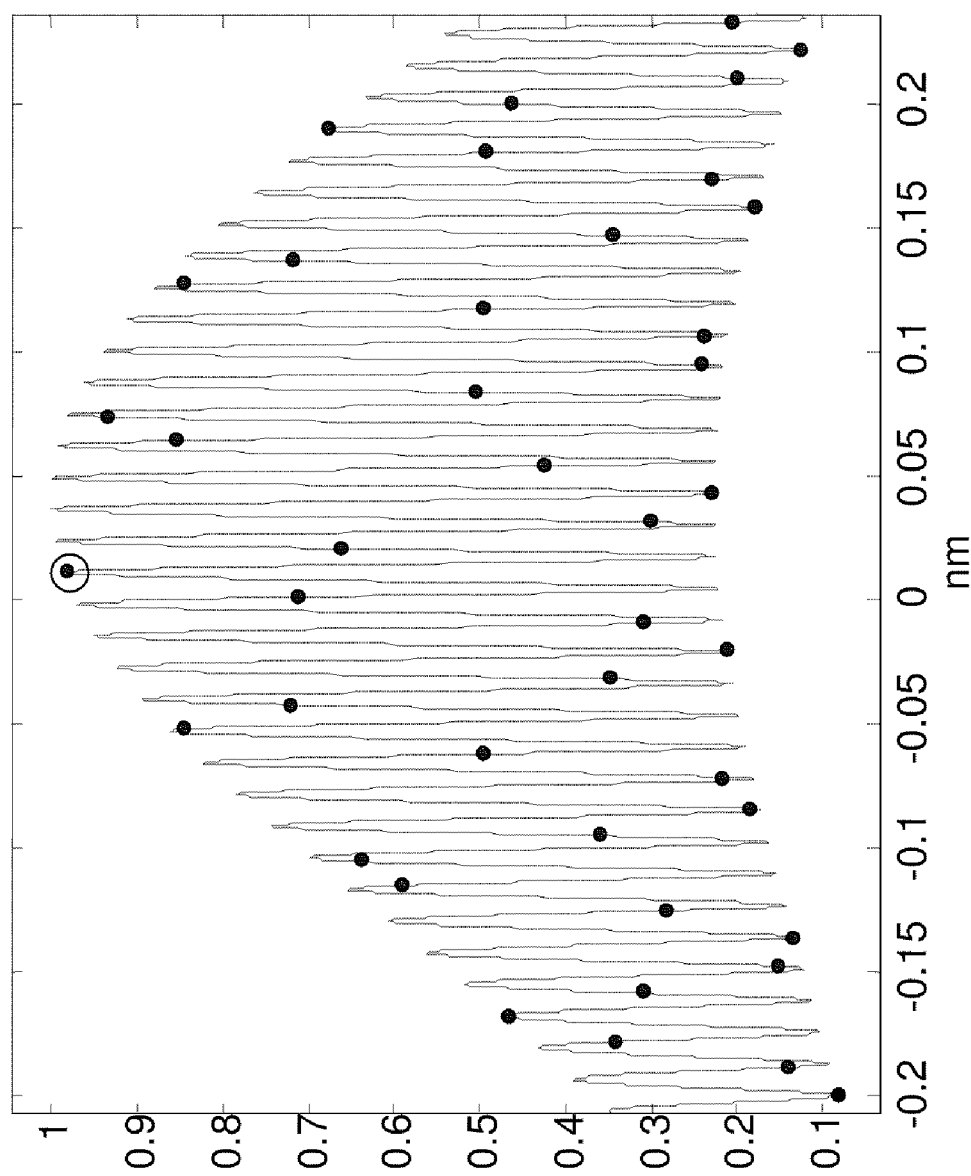
FIG. 3 illustrates a round trip extended cavity spectral reflection curve of a laser system according to the present disclosure.

One way to analyze a three mirror cavity as depicted in FIG. 1 consists in calculating the round trip loss and the cavity modes of the system. The round trip loss can be obtained by considering the system as being formed by the rear reflector of the laser, on one side and a Fabry-Perot etalon created by the laser output facet and the external feedback optical component, on the other side. The total loss of the system is then obtained from an inverse of the round-trip reflectivity given by the product of the spectral reflection curve of the DBR laser rear reflector and the Fabry-Perot reflectivity curve which is typically a sine function in the spectral space. The result is represented in FIG. 3.

The cavity modes are calculated by determining the wavelengths that can create standing waves, i.e. wavelengths where there is a round trip light wave phase change of $2\pi$. There, also, the calculation consists in considering the effective mirror system as being formed by the DBR laser rear reflector on one side and the external Fabry-Perot etalon, on the other side. Results depend on many parameters such as the reflectivities of the mirrors and their distance. It can be shown that, when the reflectivity of the external feedback optical component is larger than the reflectivity of the laser output facet, the mode structure of the system is dominated by the extended cavity, resulting in a significant decrease of the spectral distance between the modes (also called free spectral range of the system), as compared to the laser cavity without the external feedback optical component.

In summary, by adding an external feedback mirror in the system, the free spectral range is decreased and mode hops of lower spectral amplitude become possible. Also, when the external mirror reflectivity is relatively close to the one of the laser output facet, the modulation contrast shown on FIG. 3 is close to 100%. As a consequence, when an operating (lasing) cavity mode has been selected, it will move in the spectral domain when the refractive index of the material inside the laser cavity begins to change, but the reflectivity peaks of the external Fabry-Perot etalon will not move and the loss will rapidly change from a minimum value to a value close to 100%. Since the loss becomes very high, the laser will switch (hop) to a mode that has a lower loss. Adding an external cavity then results in very frequent mode hops of small amplitude in the spectral domain. In order to amplify that phenomenon, one can modulate the current applied to the gain section in order to continuously change the index of refraction of that section and therefore create high frequency and low amplitude mode hops.

According to the methodology described herein, a gain section of the laser cavity 10' is driven with a gain signal that comprises a data component, which is relatively slow and not necessarily periodic, and a modulation component, which is faster and periodic. For example, and not by way of limitation, the data component may represent the video content of a video signal and the modulation component can be a constant amplitude sinusoidal modulation at a frequency higher than the image pixel frequency. The modulation component of the gain signal is characterized by a gain modulation amplitude $I_{MOD}$ that is sufficient to shift the cavity modes in the spectral domain such that lasing at several different cavity modes for the laser cavity 10' is established sequentially as the gain signal is modulated.

More specifically, referring to FIG. 1, a low reflectivity mirror 20 is located after the PPLN crystal 40 to mostly transmit green and reflect part of the remaining IR pump. The DBR section of the DBR laser 10 provides spectral selectivity. The phase section of the DBR laser 10 typically provides no gain but allows the light phase or effective cavity length to be modulated. The front facet of the laser 10 can be coated with a relatively low reflectivity coating to form the output reflector 14. The PPLN crystal 40 can be angle polished on both sides and can be AR coated for both the green and IR wavelengths. To simplify the configuration, one convenient option is to use a PPLN crystal with an angled input facet facing DBR laser 10 and a partially reflective non angled output facet.

FIG. 3 illustrates one example of a round trip extended cavity spectral reflection curve obtained according to the above-described methodology. For completeness, it is noted that the curve of FIG. 3 has been normalized such that the maximum reflection is equal to 1.0. Referring additionally to FIG. 1, it is noted that the curve of FIG. 3 was obtained using a DBR section 30 having a full width half maximum (FWHM) spectral bandwidth of 0.4 nm, an output reflector reflectivity of 2.5%, re-circulated IR power of about 15% (including coupling loss between the DBR laser and the PPLN waveguide but neglecting nonlinear loss due to SHG), DBR laser cavity length of 3 mm (free spectral range of 0.06 nm without an extended cavity), and an extended cavity length of 44 mm.

The frequency of the reflectivity modulation represented by the curve in FIG. 3 depends on the length of the extended cavity and the depth (contrast) depends on the ratio between the reflectivities of the output reflector 14 and the external optical feedback component 20. As the ratio approaches unity, the contrast approaches 100%. The solid dots on the curve represent the wavelengths that correspond to the extended cavity modes, which can be calculated from the condition that the round trip phase change of the light wave is equal to the integer multiple of $2\pi$. Typically, although diode lasers can operate in multiple cavity modes simultaneously, when the laser is switched on, it will select and operate in the mode that has the lowest loss, i.e., the mode illustrated in FIG. 3 by the encircled dot.

When the effective length of the laser cavity is changed by modulating the gain signal, the curve in FIG. 3 will stay in place since its position in the wavelength domain is determined by the fixed distance between the output reflector 14 and the external optical feedback component 20. However, the respective positions of the extended cavity modes, as indicated by the solid dots in FIG. 3, will shift in a common direction, with some dots in the figure moving up the sloping portions of the curve and some dots moving down. The mode represented by the encircled solid dot, originally at or near the peak round-trip reflectance, will move down, indicating that the loss for this mode is increasing. At some point, the laser will switch to another mode with a higher round trip reflectance or lower round trip loss, resulting in a mode hop.

Figure 4:
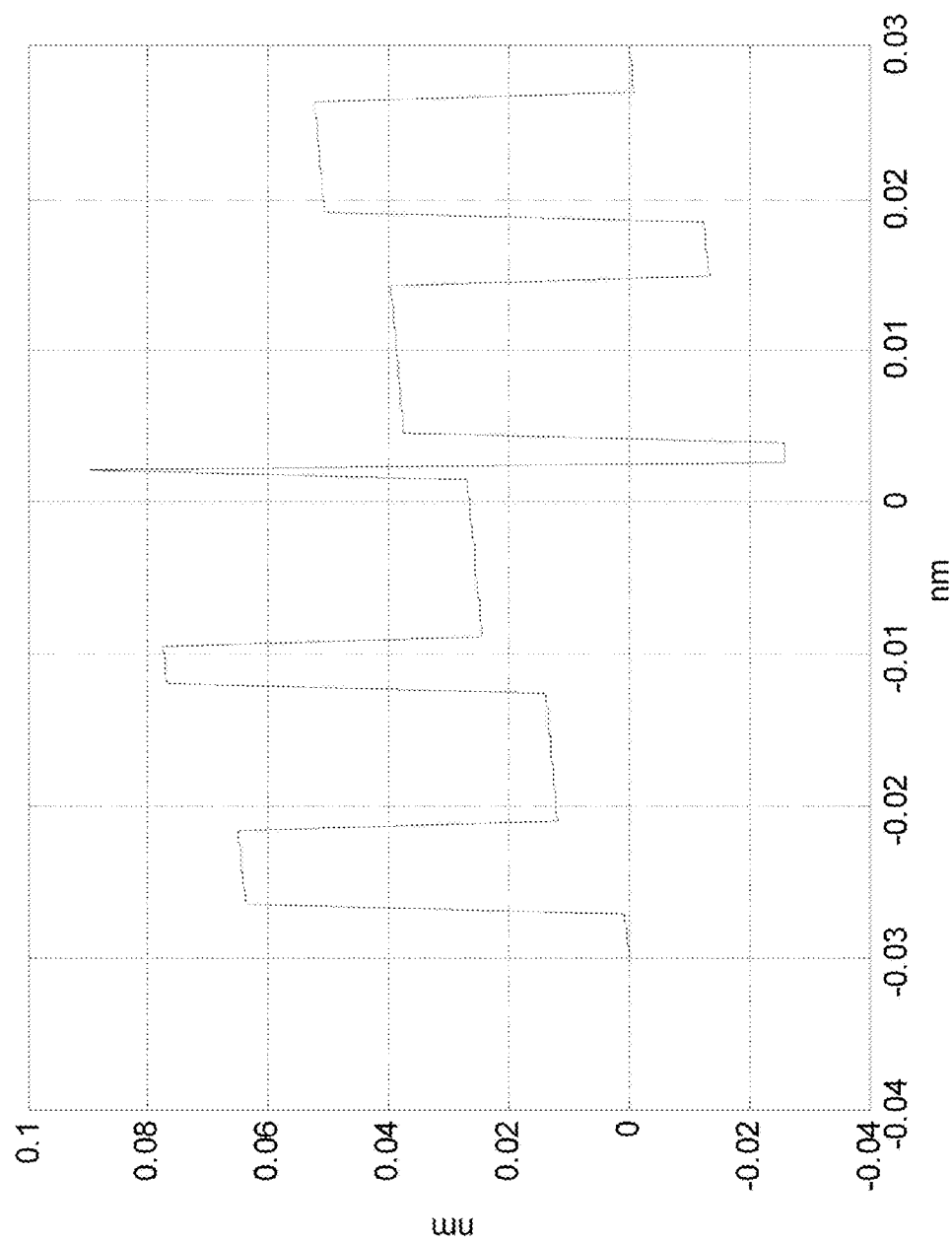
FIG. 4 is a plot of the wavelength of the extended cavity mode with the highest round trip reflectivity as a function of the diode cavity resonance shift.

FIG. 4 is a plot of the wavelength of the extended cavity mode with the highest round trip reflectivity (lowest loss) as a function of the diode cavity resonance shift. Assuming, for simplicity, that a mode hop takes place immediately after a new extended cavity mode becomes the lowest loss mode, the chart represents the evolution of the output wavelength of such a laser. In reality, the originally selected low loss mode can persist longer than illustrated, even after it is no longer the low loss mode, due to phenomena such as spatial hole burning and photon-electron dynamics.

Comparing laser sources with and without the extended cavity described herein, it is noted that, when the effective cavity length changes in a laser source without the extended cavity, the originally-selected low loss mode typically follows the shifting cavity resonance, until the laser hops to the another resonance closest to the Bragg reflection peak. Unfortunately, the new mode is often separated from the old one by more than one spectral range. For laser sources employing the extended cavity described herein, when the gain signal is modulated, the operating mode can move quickly down the effective reflectivity curve and force the laser to select a new operating mode before departing significantly from the Bragg reflection peak. As such, the new mode will be very close in wavelength to the original mode, and will rarely be further away than one free spectral range of the laser cavity without an external mirror. Accordingly, even though the gain signal is modulated to instigate mode hopping, the operating wavelength will remain close to the Bragg reflection peak and only small changes in the output power of the wavelength conversion device will result.

Referring again to the laser source 100' illustrated schematically in FIG. 2, in practicing the methodology described herein, it is noted that the extended laser cavity 16' defined by the rear reflector 12' and the external optical feedback component 20' can be configured to optimize output stability by ensuring that lasing at several different cavity modes can be established within the FWHM spectral bandwidth of the reflection peak of the wavelength selective component 30' and within the FWHM conversion bandwidth of the wavelength conversion device 40'. To do so, the external cavity can be configured such that several periodic Fabry-Perot resonances fall within the FWHM spectral bandwidth of the reflection peak of the wavelength selective component 30' and within the FWHM conversion bandwidth of the wavelength conversion device 40'. For example, and not by way of limitation, where the FWHM spectral bandwidth of the reflection peak of the wavelength selective component 30' is between approximately 0.4 nm and approximately 0.6 nm and the FWHM conversion bandwidth of the wavelength conversion device 40' is approximately 0.1 nm, the periodic Fabry-Perot resonances can be spaced apart by approximately 0.0125 nm. Alternatively, and again without limiting the scope of the present disclosure, the periodic Fabry-Perot resonances, the spacing of which is a function of the relative positioning of the output reflector 14' and the external optical feedback component 20' along the optical path, can be spaced apart by approximately 0.025 nm or less. The portion of the optical path between the output reflector 14' and the external optical feedback component 20' preferably should be longer than the portion of the optical path within the laser cavity 10'.

Since a modulation signal is applied to the gain section of the laser, a correction needs to be added to the signal in order to avoid any image artifacts. Because many wavelength conversion devices introduce nonlinearity into the laser source, the frequency converted output power of the laser source can also be non-linear:

$$P_{2v}=k(I_{DATA}+I_{MOD})^2$$

where $P_{2v}$ represents the wavelength converted output power, $I_{DATA}$ represents the data component of the gain signal, $I_{MOD}$ represents the modulation component of the gain signal, and k represents a constant. As a consequence, the methodology disclosed herein also contemplates correction for this nonlinearity by incorporating a subtractive modulation component in the gain signal $I_g$ according to the following relation:

$$I_g=(P_{2v}/k)^{0.5}-I_{MOD}$$

To ensure that there is no negative voltage applied to the gain section, the corrected gain signal $I_g$ can be limited to values at or above zero.

The gain signal $I_g$ can also be corrected to compensate for the output power non-linearity by making the modulation component $I_{MOD}$ of the gain signal proportional to the data component $I_{DATA}$ of the gain signal:

$$I_{MOD}=\alpha I_{DATA}$$

where $\alpha$ represents a constant. In that case, the frequency doubled power can be written as:

$$P_{2v}=k(1+\alpha)^2 I_{DATA}^2$$

The correction to apply to the video signal becomes then:

$$I_g=(P_{2v}/k)^{0.5}/(1+\alpha)$$

One interesting feature with this last formula is that images that are digitally stored usually contain a correction factor that is used to compensate the non linearity of conventional displays such as LCD or CRT screens. That correction factor is known as the gamma correction. The consequence is that, for laser projection systems, images need to be counter-compensated by using the following formula:

$$I_{DATA}=I_{DIGITAL}^{\gamma}$$

Where the coefficient gamma is usually close to 2.2. By injecting this formula into the previous one, we end up with the following:

$$I_g=(I_{DIGITAL}^{1.1}/k^{0.5})/(1+\alpha)$$

By considering the (1.1) exponent close enough to unity, the current into the gain section can be considered, in first approximation as a linear function of the digital information and only linear corrections are needed.

To avoid image artifacts, the gain modulation frequency $f_{MOD}$ of the modulation component of the gain signal should meet or exceed the data frequency $f_{DATA}$ of the data component of the gain signal. In addition, the gain modulation frequency $f_{MOD}$ can also be synchronized with the data frequency $f_{DATA}$ of the data component of the gain signal to avoid image aliasing. For synchronization, it is contemplated that the gain modulation frequency $f_{MOD}$ can be synchronized with the data frequency $f_{DATA}$ or a multiple thereof.

Although the external optical feedback component is illustrated in FIGS. 1 and 2 as a stand-alone reflector, it is contemplated that the feedback component may be provided in a variety of forms to introduce the extended cavity described herein, including, for example, by forming a dichroic mirror as a reflective coating on an output face of the wavelength conversion device. In addition, to optimize the integrity of the extended cavity, the respective reflectivities of the external optical feedback component and the output reflector should be of the same order of magnitude.

Also, for optimum performance it is preferable to keep the reflectivity of the output reflector and the external optical feedback component relatively low because high reflectivities can increase the power density inside the laser and affect the reliability of the system. Also, high feedback can create instability and decrease conversion efficiency because the wavelength conversion devices typically introduce additional losses at wavelengths that correspond to the maximum of the conversion efficiency. Modes that have low conversion are therefore preferentially selected resulting in lower efficiency. Experimentally, we observed that best results were obtained with laser output reflectivities in the 0.5-2.5% range and feedback amplitude in the 5-20% range. When increasing the feedback reflectivity, experiments indicate that the laser falls into some operating modes where the spectral width significantly increases resulting in a drop of the conversion efficiency. Also, theory predicts that this approach should work with longer extended cavities since increasing the distance of the external cavity mirror decreases the spacing between the cavity modes. However, because of the package size limitations, the distance from the laser output facet to the external feedback component is typically relatively short, e.g., in the 20 mm to 30 mm range.

The wavelength selective component may also be provided in a variety of forms and locations along the optical path of the laser source. For example, in the embodiment of FIG. 1, the wavelength selective component comprises a distributed Bragg reflector 30 of a DBR laser 10. In other embodiments, the wavelength selective component 30 could be located in the extended cavity or anywhere else along the optical path of the laser source, including, for example, as a grating formed in the wavelength conversion device 40, which is also located along the optical path in the extended laser cavity 16'.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects. For example, it is contemplated that the methodology disclosed herein may be applied to control schemes where the wavelength selective section of the laser cavity, i.e., a DBR section of a DBR laser, may be driven with a DBR signal that comprises a modulation component having a modulation amplitude $I_{MOD}$ that is sufficient to shift the available cavity modes in the spectral domain such that lasing at several different cavity modes sequentially is established as the DBR signal is modulated.

For the purposes of describing and defining the present invention, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term "approximately" is also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. A method of controlling a frequency-converted laser source comprising a laser cavity, an external optical feedback component, a wavelength selective component, and a wavelength conversion device, wherein:
   the laser cavity comprises a gain medium interposed between a relatively high reflectivity rear reflector and a relatively low reflectivity output reflector and is configured to emit light through the output reflector;
   the external optical feedback component is displaced from the output reflector along an optical path of the laser source and is configured to return light to the laser cavity through the output reflector by partially reflecting the emitted light;
   the wavelength conversion device is located along the optical path of the laser source and is characterized by a spectral acceptance curve having a full width at half maximum (FWHM);
   the rear reflector, the output reflector, and the external optical feedback component define available cavity modes, and the wavelength selective component ensures that laser operation can only happen in available cavity modes located within the FWHM of the wavelength conversion device;
   the method comprises driving a gain section of the laser cavity with a gain signal that comprises a data component and a modulation component; and
   the modulation component of the gain signal comprises a gain modulation amplitude $I_{MOD}$ that is sufficient to shift the available cavity modes in the spectral domain such that lasing at several different cavity modes sequentially is established as the gain signal is modulated, wherein:
   the wavelength converted output power of the lasing mode is a non-linear function of the gain signal;
   the gain signal is corrected to compensate for the output power non-linearity; and
   the gain signal is corrected by establishing the gain signal $I_g$ according to the following relation:

$$I_g = (I_{DATA}/k)^{0.5} - I_{MOD}$$

where $I_{DATA}$ represents the data component of the gain signal, $I_{MOD}$ represents the modulation component of the gain signal, and k represents a constant.

2. A method as claimed in claim 1 wherein the wavelength selective component is characterized by a reflection peak having a FWHM spectral bandwidth and the parameters of the system are such that lasing at several different cavity modes can be established within the FWHM spectral bandwidth of the reflection peak of the wavelength selective component and within a FWHM conversion bandwidth of the wavelength conversion device.

3. A method as claimed in claim 1 wherein the rear reflector and the external optical feedback component define an extended laser cavity having a length smaller than 30 mm.

4. A method as claimed in claim 2 wherein:
   the FWHM spectral bandwidth of the reflection peak of the wavelength selective component is between approximately 0.4 nm and approximately 0.6 nm;
   the FWHM conversion bandwidth of the wavelength conversion device is between approximately 0.1 nm and approximately 0.2 nm; and the relative positioning of the output reflector and the external optical feedback component along the optical path generate periodic Fabry-Perot resonances spaced apart by approximately 0.0125 nm.

5. A method as claimed in claim 1 wherein the relative positioning of the output reflector and the external optical feedback component along the optical path generate periodic Fabry-Perot resonances spaced apart by approximately 0.025 nm or less.

6. A method as claimed in claim 1 wherein:
the rear reflector and the external optical feedback component form an extended laser cavity along the optical path; and
the relative positioning of the output reflector and the external optical feedback component generate Fabry-Perot resonances along the optical path.

7. A method as claimed in claim 6 wherein the extended laser cavity includes the portion of the optical path in the laser cavity.

8. A method as claimed in claim 6 wherein:
the frequency of the Fabry-Perot resonances in the laser cavity is a function of the optical displacement between the external optical feedback component and the output reflector; and
the depth of the Fabry-Perot resonances in the laser cavity is a function of the respective reflectivities of the external optical feedback component and the output reflector.

9. A method as claimed in claim 1 wherein the modulation component of the gain signal comprises a gain modulation frequency $f_{MOD}$ that meets or exceeds the data frequency $f_{DATA}$ of the data component of the gain signal.

10. A method as claimed in claim 1 wherein the modulation component of the gain signal comprises a gain modulation frequency $f_{MOD}$ that is synchronized with the data frequency $f_{DATA}$ of the data component of the gain signal to avoid image aliasing.

11. A method as claimed in claim 1 wherein
the rear reflector has a reflectivity coefficient larger than approximately 75%;
the output reflector has a reflectivity coefficient lower than approximately 5%; and
the round trip loss curve has a modulation contrast that exceeds approximately 50%.

12. A method as claimed in claim 1 wherein the respective reflectivities of the external optical feedback component and the output reflector are of the same order of magnitude.

13. A method as claimed in claim 1 wherein:
the external optical feedback component comprises a stand-alone dichroic mirror or a reflective coating formed on an output face of the wavelength conversion device;
the output face of the wavelength conversion device is not angled; and
the external optical feedback component is partly reflective at the wavelength of the lasing mode and at the converted wavelength of the lasing mode.

14. A method as claimed in claim 1 wherein the wavelength selective component is located in the laser cavity or along the optical path of the laser source and comprises a distributed Bragg reflector of a DBR laser or a grating formed in the wavelength conversion device.

15. A method as claimed in claim 1 wherein:
the output reflector and the external optical feedback component form an extended laser cavity along the optical path; and
the wavelength conversion device is located in the extended laser cavity.

16. A method of controlling a frequency-converted laser source comprising a laser cavity, an external optical feedback component, a wavelength selective component, and a wavelength conversion device, wherein:
the laser cavity comprises a gain medium interposed between a relatively high reflectivity rear reflector and a relatively low reflectivity output reflector and is configured to emit light through the output reflector;
the external optical feedback component is displaced from the output reflector along an optical path of the laser source and is configured to return light to the laser cavity through the output reflector by partially reflecting the emitted light;
the wavelength conversion device is located along the optical path of the laser source and is characterized by a spectral acceptance curve having a full width at half maximum (FWHM);
the rear reflector, the output reflector, and the external optical feedback component define available cavity modes, and the wavelength selective component ensures that laser operation can only happen in available cavity modes located within the FWHM of the wavelength conversion device;
the method comprises driving a gain section of the laser cavity with a gain signal that comprises a data component and driving a wavelength selective section of the laser cavity with a signal that comprises a modulation component; and
the modulation component comprises a modulation amplitude $I_{MOD}$ that is sufficient to shift the available cavity modes in the spectral domain such that lasing at several different cavity modes sequentially is established as the signal is modulated;
the wavelength converted output power of a lasing mode is a non-linear function of the gain signal;
the gain signal is corrected to compensate for an output power non-linearity; and
the gain signal is corrected by establishing the gain signal $I_g$ according to the following relation:

$$I_g = (I_{DATA}/k)^{0.5} - I_{MOD}$$

where $I_{DATA}$ represents the data component of the gain signal, $I_{MOD}$ represents the modulation component of the modulation amplitude, and k represents a constant.

* * * * *